US012645850B2

(12) United States Patent
Lomas et al.

(10) Patent No.: US 12,645,850 B2
(45) Date of Patent: Jun. 2, 2026

(54) TESTING AN AUTONOMY STACK FOR AN AUTONOMOUS VEHICLE IN A SIMULATED ENVIRONMENT

(71) Applicant: Oxa Autonomy Ltd, Oxford (GB)

(72) Inventors: David Brian Lomas, Oxford (GB); Robert Ruck, Oxford (GB)

(73) Assignee: Oxa Autonomy Ltd, Oxford (GB)

( * ) Notice: Subject to any disclaimer, the term of this patent is extended or adjusted under 35 U.S.C. 154(b) by 105 days.

(21) Appl. No.: 18/408,235

(22) Filed: Jan. 9, 2024

(65) Prior Publication Data

US 2025/0225292 A1     Jul. 10, 2025

(51) Int. Cl.
*G06F 30/20* (2020.01)

(52) U.S. Cl.
CPC .................................... *G06F 30/20* (2020.01)

(58) Field of Classification Search
None
See application file for complete search history.

(56) References Cited

U.S. PATENT DOCUMENTS

| | | | | |
|---|---|---|---|---|
| 12,037,013 | B1 * | 7/2024 | Linscott ................. | G06N 20/00 |
| 2005/0286767 | A1 | 12/2005 | Hager et al. | |
| 2007/0209585 | A1 * | 9/2007 | Ebensberger ............ | G09B 9/00 |
| | | | | 118/682 |
| 2014/0204081 | A1 | 7/2014 | Dobes et al. | |
| 2016/0293139 | A1 * | 10/2016 | Kwon ................. | G06F 3/03547 |

| | | | | |
|---|---|---|---|---|
| 2019/0129436 | A1 | 5/2019 | Sun et al. | |
| 2019/0129831 | A1 * | 5/2019 | Goldberg ............ | G06F 11/3698 |
| 2020/0379481 | A1 | 12/2020 | Newman et al. | |
| 2021/0387628 | A1 * | 12/2021 | Wang .............. | B60W 30/18163 |
| 2022/0185323 | A1 * | 6/2022 | Dolben .............. | B60W 60/0011 |
| 2023/0043905 | A1 * | 2/2023 | Zhu ................... | B60W 50/0205 |

(Continued)

FOREIGN PATENT DOCUMENTS

| | | | |
|---|---|---|---|
| RU | 2658679 | C1 | 6/2018 |
| WO | 2023062390 | A1 | 4/2023 |
| WO | 2023062392 | A1 | 4/2023 |

(Continued)

OTHER PUBLICATIONS

Examination Report for GB Patent Application No. 2114809.3, Apr. 11, 2022, 5 pgs.

(Continued)

*Primary Examiner* — Peter D Nolan
*Assistant Examiner* — Jacob Kent Besteman-Street
(74) *Attorney, Agent, or Firm* — KPPB LLP

(57) ABSTRACT

The present disclosure relates to a computer-implemented method of testing an autonomy stack for an autonomous vehicle in a simulated environment. The computer-implemented method comprises: receiving a scenario, a non-ego agent, and an ego agent, the scenario representing a real-world environment, wherein the ego agent is controlled by the autonomy stack; running a simulation of the scenario including the ego agent and the non-ego agent; receiving, from a user input device, a control change input; switching control of the non-ego agent between the autonomy mode and the manual mode in response to receiving the control change input; recording a sequence of events involving the ego agent to form a report; and sending a signal including the report to a report log.

17 Claims, 5 Drawing Sheets

(56) References Cited

U.S. PATENT DOCUMENTS

2024/0149913 A1* 5/2024 Campbell ......... B60W 60/0015

FOREIGN PATENT DOCUMENTS

| | | | |
|---|---|---|---|
| WO | 2023062393 A1 | 4/2023 | |
| WO | 2023062394 A1 | 4/2023 | |
| WO | 2023067325 A1 | 4/2023 | |
| WO | 2023067326 A1 | 4/2023 | |
| WO | 2023067327 A1 | 4/2023 | |

OTHER PUBLICATIONS

GB Patent Application No. 2114945.5, Jun. 21, 2022, 19 pgs.

International Preliminary Patentability Report for International Application No. PCT/GB2022/0052652, Apr. 23, 2024, 12 pgs.

International Preliminary Report on International Application No. PCT/GB2022/052640, Issued Apr. 16, 2024, 7 pgs.

International Preliminary Report on Patentability for International Application No. PCT/GB2022/052630, Issued Apr. 16, 2024, 10 pgs.

International Preliminary Report on Patentability for International Application No. PCT/GB2022/052636, Report Issued Apr. 16, 2024, 7 pgs.

International Preliminary Report on Patentability for International Application No. PCT/GB2022/052650, Apr. 23, 2024, 18 pgs.

International Preliminary Report on Patentability for International Application No. PCT/GB2022/052651, Apr. 23, 2024, 19 pgs.

International Preliminary Report on Patentability for International Application No. PCT/GB2022/52639, Issued Apr. 16, 2024, 7 pgs.

International Search Report and Written Opinion for International Application No. PCT/GB2022/0052652, Search completed Jan. 9, 2023, Mailed Jan. 20, 2023, 14 Pgs.

International Search Report and Written Opinion for International Application No. PCT/GB2022/052630, Search completed Jan. 10, 2023, Mailed Jan. 20, 2023, 12 Pgs.

International Search Report and Written Opinion for International Application No. PCT/GB2022/052636, Search completed Dec. 21, 2022, Mailed Jan. 5, 2023, 11 Pgs.

International Search Report and Written Opinion for International Application No. PCT/GB2022/052640, Search completed Jan. 3, 2023, Mailed Jan. 18, 2023, 09 Pgs.

International Search Report and Written Opinion for International Application No. PCT/GB2022/052650, Search completed Jan. 12, 2023, Mailed Jan. 20, 2023, 26 Pgs.

International Search Report and Written Opinion for International Application No. PCT/GB2022/052651, Search completed Jan. 13, 2023, Mailed Jan. 31, 2023, 23 Pgs.

International Search Report and Written Opinion for International Application No. PCT/GB2022/52639, Search completed Dec. 29, 2022, Mailed Jan. 18, 2023, 09 Pgs.

Search Report and Written Opinion for GB Application No. 2114808.5, Search completed May 27, 2022, 9 pgs.

Search Report for GB Patent Application No. 2114944.8, Jul. 29, 2022, 12 pgs.

Behzadan et al., "Adversarial Reinforcement Learning Framework for Benchmarking Collision Avoidance Mechanisms in Autonomous Vehicles", arXiv:1806.01368v1 [cs.RO] Jun. 4, 2018.

Bosse et al., "Keypoint design and evaluation for place recognition in 2D lidar maps", Robotics And Autonomous Systems, Elsevier BV, Amsterdam, NL, vol. 57, No. 12, Dec. 31, 2009 (Dec. 31, 2009), pp. 1211-1224, XP026746016, ISSN: 0921-8890, DOI: 10.1016/J.ROBOT.2009.07.009.

Brownlee, "How to Calculate Principal Component Analysis (PCA) from Scratch in Python", https://machinelearningmastery.com/, Aug. 9, 2019, pp. 1-28, XP055924999, Retrieved from the Internet: URL: https://machinelearningmastery.com/calculate-principalcomponent-analysis-scratch-python/.

Cen et al., "Precise Ego-Motion Estimation with Millimeter-Wave Radar Under Diverse and Challenging Conditions", 2018 IEEE International Conference on Robotics and Automation (ICRA), May 21, 2018, pp. 1-8, XP033403205, DOI: 10.1109/ICRA.2018.8460687.

Cen et al., "Radar-only ego-motion estimation in difficult settings via graph matching", 2019 International Conference on Robotics and Automation (ICRA), IEEE, May 20, 2019, pp. 298-304, XP033593985, DOI: 10.1109/ICRA.2019.8793990.

Chen et al., "GeoSim: Realistic Video Simulation via Geometry-Aware Composition for Self-Driving", Proceedings of the IEEE/CVF Conference on Computer Vision and Pattern Recognition (CVPR), 2021, pp. 7230-7240.

De Martini et al., "kRadar++: Coarse-to-Fine FMCW Scanning Radar Localisation", Sensors, MDPI, CH, Nov. 1, 2020, vol. 20, No. 21, pp. 1-23, XP009535871, ISSN: 1424-8220, DOI: 10.3390/S20216002.

Ding et al., "CMTS: A Conditional Multiple Trajectory Synthesizer for Generating Safety-Critical Driving Scenarios", arXiv:1910.00099v2 [cs.LG] Oct. 2, 2019.

Ding et al., "Learning to Collide: An Adaptive Safety—Critical Scenarios Generating Method", arxiv.org, Cornell University Library, Cornell University Ithaca, NY 14853, Jul. 23, 2020, XP081706097.

Gawel et al., "Structure-based vision-laser matching", 2016 IEEE/RSJ International Conference On Intelligent Robots And Systems (IROS), IEEE, Oct. 9, 2016, pp. 182-188, XP033011403, DOI: 10.1109/IROS.2016.7759053.

Gleave et al., "Adversarial Policies: Attacking Deep Reinforcement Learning", arXiv:1905.10615v3 [cs.LG] Jan. 17, 2021.

Himstedt et al., "Large scale place recognition in 2D LIDAR scans using Geometrical Landmark Relations", 2014 IEEE/RSJ International Conference on Intelligent Robots and Systems, IEEE, Sep. 14, 2014, pp. 5030-5035, XP032676853, DOI: 10.1109/IROS.2014.6943277.

Koren et al., "Adaptive Stress Testing for Autonomous Vehicles", arXiv:1902.01909v1 [cs.RO] Feb. 5, 2019.

Koren et al., "The Adaptive Stress Testing Formulation", arXiv:2004.04293v1 [cs.RO] Apr. 8, 2020.

Kuhnl, "Road Terrain Detection for Advanced Driver Assistance System", May 21, 2013, pp. 1-152, XP055117968, Retrieved from the Internet: URL: http://pub.uni-bielefeld.de/luur/download?func=downloadFile&recordOld=2633277&fileOld=2633278.

Kuutti et al., "Training Adversarial Agents to Exploit Weaknesses in Deep Control Policies", arXiv:2002.12078v1 [cs.LG] Feb. 27, 2020.

Lee et al., "Adaptive Stress Testing: Finding Likely Failure Events with Reinforcement Learning", arxiv.org, Cornell University Library, 201 Olin Library Cornell University Ithaca, NY 14853, Dec. 4, 2020, XP081829250.

Machida et al., "Deep Photo Relighting by Integrating Both 2D and 3D Lighting Information", 2020 25TH International Conference On Pattern Recognition (ICPR), IEEE, Jan. 10, 2021 (Jan. 10, 2021), pp. 8446-8452, XP033908865, DOI: 10.1109/ICPR48806.2021.9413179.

Park et al., "Semantic Image Synthesis with Spatially-Adaptive Normalization", arXiv:1903.07291v2 [cs.CV] Nov. 5, 2019.

Porav et al., "Adversarial Training for Adverse Conditions: Robust Metric Localisation using Appearance Transfer", arXiv:1803.03341v1 [cs.CV] Mar. 9, 2018.

Porav et al., "Don't Worry About the Weather: Unsupervised Condition-Dependent Domain Adaptation", arXiv:1907.11004v1 [cs.CV], Jul. 25, 2019, Retrieved from: https://arxiv.org/pdf/1907.11004, 8 pgs.

Porav et al., "Don't Worry About the Weather: Unsupervised Condition-Dependent Domain Adaptation", 2019 IEEE Intelligent Transportation Systems Conference (ITSC), IEEE, Oct. 27, 2019, pp. 33-40, XP033668402, DOI: 10.1109/ITSC.2019.8917073.

Qi et al., "Semi-parametric Image Synthesis", arXiv:1804.10992v1 [cs.CV] Apr. 29, 2018.

Ren et al., "Learning Traffic Behaviors by Extracting Vehicle Trajectories from Online Video Streams", 2018 IEEE 14th International Conference on Automation Science and Engineering (CASE), published 2018, IEEE, pp 1276-1283.

(56)     References Cited

OTHER PUBLICATIONS

Sarlin et al., "From Coarse to Fine: Robust Hierarchical Localization at Large Scale", rxiv.org, Cornell University Library, 201 OLIN Library Cornell University Ithaca, NY 14853, Dec. 9, 2018, XP081200041.

Uricar et al., "Yes, we GAN: Applying Adversarial Techniques for Autonomous Driving", arxiv.org, Cornell University Library, 201 Olin Library Cornell University Ithaca, NY 14853, Feb. 9, 2019, XP081590898, DOI: 10.2352/ISSN.2470-1173.2019.15.AVM-048.

Wang et al., "AdvSim: Generating Safety-Critical Scenarios for Self-Driving Vehicles", 2021 IEEE/CVF Conference on Computer Vision and Pattern Recognition (CVPR).

Wang et al., "High-Resolution Image Synthesis and Semantic Manipulation with Conditional GANs", arXiv:1711.11585v2 [cs. CV] Aug. 20, 2018.

\* cited by examiner

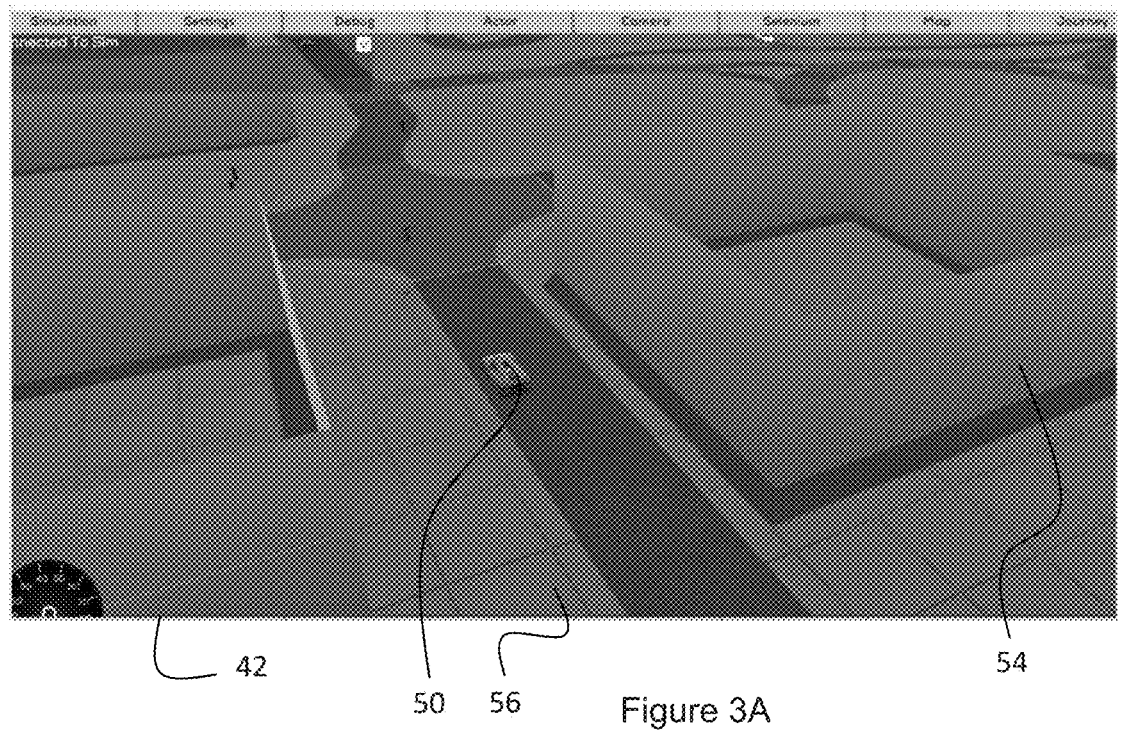
42    50    56    Figure 3A    54
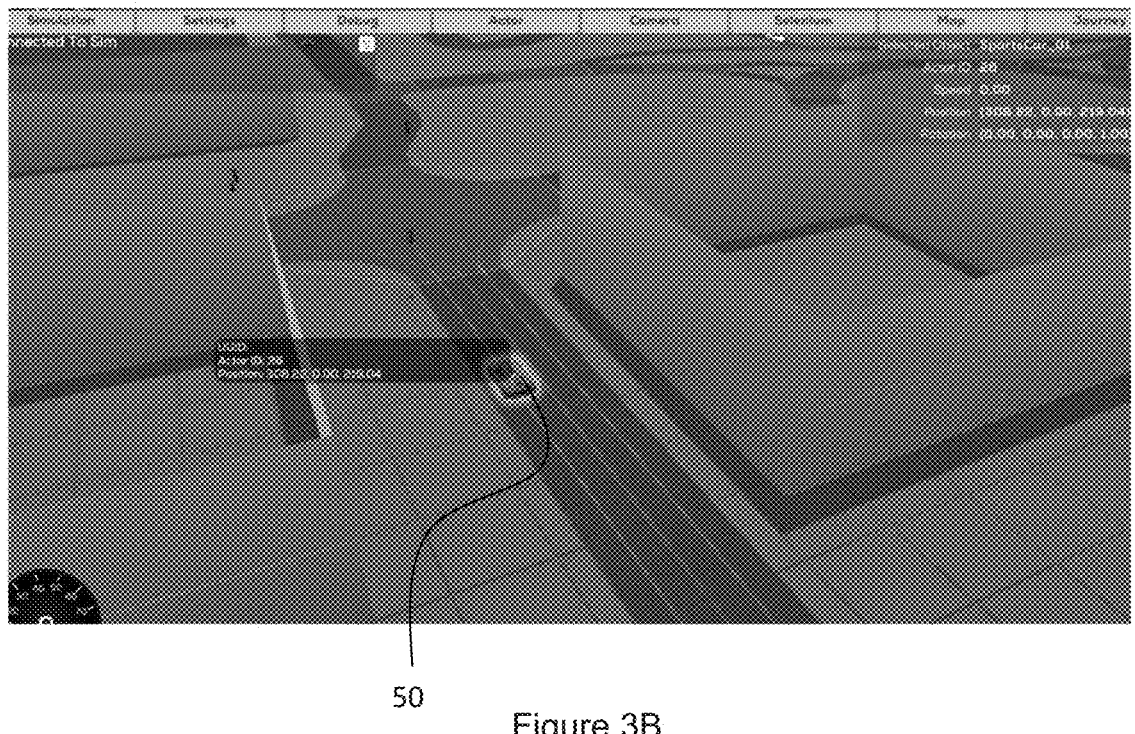
50    Figure 3B

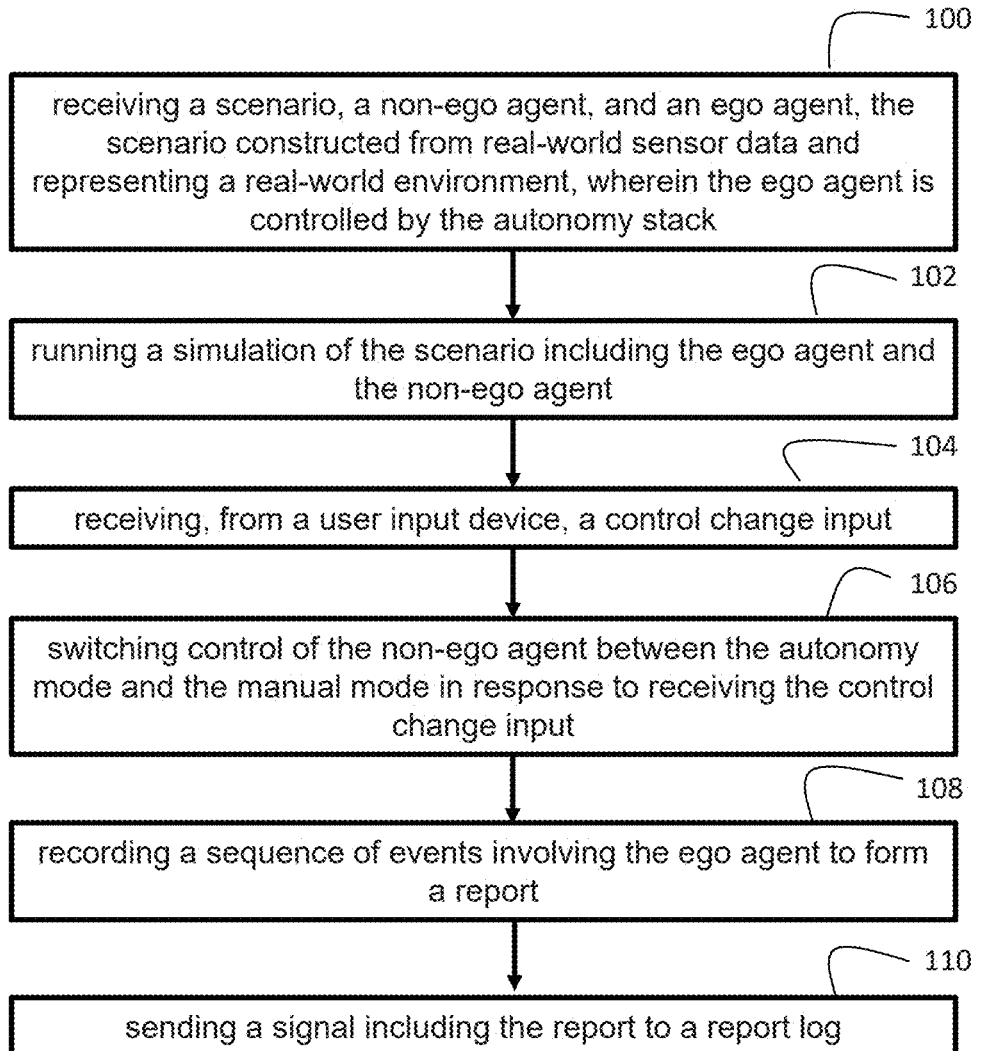

receiving a scenario, a non-ego agent, and an ego agent, the scenario constructed from real-world sensor data and representing a real-world environment, wherein the ego agent is controlled by the autonomy stack running a simulation of the scenario including the ego agent and the non-ego agent receiving, from a user input device, a control change input switching control of the non-ego agent between the autonomy mode and the manual mode in response to receiving the control change input recording a sequence of events involving the ego agent to form a report sending a signal including the report to a report log

Figure 4

TESTING AN AUTONOMY STACK FOR AN AUTONOMOUS VEHICLE IN A SIMULATED ENVIRONMENT

FIELD

The subject-matter of the present disclosure relates to testing autonomy stacks for autonomous vehicles in a simulated environment, and transitory, or non-transitory, computer-readable media.

BACKGROUND

It is possible to test an autonomy stack for an autonomous vehicle in a simulated environment. The simulated environment includes a scenario that is typically constructed from real-world sensor data that represents a real-world environment. The sensor data typically has been captured using sensors such as LiDAR, RADAR, and cameras, while the autonomy vehicle operates in the real-world.

Testing the autonomy stack typically aims to identify any infractions that occur between an ego-vehicle controlled by the autonomy stack and various features of the scenarios, e.g. one or more agents in the scenario. Once infractions have been identified, the autonomy stack can be modified to help avoid such infractions occurring in future when the same, or similar, scenarios are encountered.

However, obtaining sufficient scenarios is burdensome because it would require many hours of the autonomous vehicle operating in the real-world.

It is an aim of the present invention to address such problems and improve on the prior art.

SUMMARY

According to an aspect of the present disclosure, there is provided a computer-implemented method of testing an autonomy stack for an autonomous vehicle in a simulated environment, the computer-implemented method comprising: receiving a scenario, a non-ego agent, and an ego agent, the scenario representing a real-world environment, wherein the ego agent is controlled by the autonomy stack; running a simulation of the scenario including the ego agent and the non-ego agent; receiving, from a user input device, a control change input; switching control of the non-ego agent between the autonomy mode and the manual mode in response to receiving the control change input; recording a sequence of events involving the ego agent to form a report; and sending a signal including the report to a report log. In this way, it is possible to increase a number of scenarios that an autonomy stack encounters in the simulated environment without having to obtain the data solely by driving the autonomous vehicle in the real-world. In addition, it is possible to expand the scenarios to cover situations that are unlikely to be encountered in the real-world, such as a vehicle driving through a red light at high speed and performing a U-turn whilst other vehicles are in the junction. Therefore, a more robust autonomy stack will ultimately be obtained.

In an embodiment, the computer-implemented method further comprises: controlling the non-ego agent in an autonomy mode using an autonomy agent logic.

In an embodiment, the computer-implemented method further comprising: controlling the non-ego agent in the manual mode using inputs from the user input device.

In an embodiment, the user input device includes at least one direction input to control a direction of travel of the non-ego agent, and a plurality of push buttons to control one or more kinematic parameters of the non-ego agent.

In an embodiment, the one or more kinematic parameters is selected from a list of kinematic parameters including, velocity, acceleration, and deceleration.

In an embodiment, the computer-implemented method further comprises: identifying an infraction between the ego agent and the non-ego agent, and recording the infraction as an event of the sequence of events.

In an embodiment, the infraction is selected from a list of infractions including: a collision involving the ego agent, a distance between the ego agent an object in the scenario being less than a minimum distance threshold, a deceleration of the ego agent being greater than a deceleration threshold, an acceleration of the ego agent being greater than an acceleration threshold, a turn radius of the ego agent being greater than a turn radius threshold, and a jerk of the ego agent being greater than the turn radius threshold.

In an embodiment, the non-ego agent is an object selected from a list of objects including: a vehicle, a human, and a non-human animal.

In an embodiment, the computer-implemented method further comprises: displaying the simulation on a display device.

In an embodiment, the computer-implemented method further comprises: receiving, from the user input device, a selection input selecting the non-ego agent; and highlighting the non-ego agent on the display device in response to receiving the selection input selecting the non-ego agent.

In an embodiment, the highlighting the non-ego agent on the display device prior to: receiving the control change input; and switching control of the non-ego agent between the autonomy mode and the manual mode in response to receiving the control change input.

In an embodiment, the receiving the control change input comprises receiving a user selection of a toggle enabling toggling between the autonomy mode and the manual mode.

In an embodiment, the computer-implemented method, further comprises: displaying on the display device a drop-down menu including the toggle.

In an embodiment, the sequence of events involves events where the ego agent interacts with the non-ego agent.

In an embodiment, the switching control of the non-ego agent between the autonomy mode and the manual mode comprises, starting the simulation with the non-ego agent in the autonomy mode and switching control of the non-ego agent to the manual mode in response to receiving the control change input.

In an embodiment, the scenario is constructed from real-world sensor data.

According to an aspect of the present disclosure, there is provided a transitory, or non-transitory, computer-readable medium, having instructions stored thereon that when executed by one or more processors, cause the one or more processors to perform the computer-implemented method of any preceding aspect or embodiment.

According to an aspect of the present disclosure, there is provided a simulation system comprising: storage having a scenario, a non-ego agent, an ego agent, and instructions stored thereon, the scenario representing a real-world environment, wherein the ego agent is controlled by the autonomy stack; and at least one processor configured to execute the instructions to: receiving a scenario, a non-ego agent, and an ego agent from the storage; running a simulation of the scenario including the ego agent and the non-ego agent; receiving, from a user input device, a control change input; switching control of the non-ego agent between the autonomy mode and the manual mode in response to receiving the control change input; recording a sequence of events involving the ego agent to form a report; and sending a signal including the report to a report log.

BRIEF DESCRIPTION OF DRAWINGS

The subject-matter of the present disclosure is best described with reference to the accompanying figures, in which:

FIGS. 3A to 3C show screen shots from a display of the simulation system of FIG. 2 that show switching control of an agent between an autonomy mode and a manual mode, according to one or more embodiments;

FIG. 4 shows a flow chart summarising a computer-implemented method of testing an autonomy stack in a simulated environment, according to one or more embodiments.

DESCRIPTION OF EMBODIMENTS

At least some of the example embodiments described herein may be constructed, partially or wholly, using dedicated special-purpose hardware. Terms such as 'component', 'module' or 'unit' used herein may include, but are not limited to, a hardware device, such as circuitry in the form of discrete or integrated components, a Field Programmable Gate Array (FPGA) or Application Specific Integrated Circuit (ASIC), which performs certain tasks or provides the associated functionality. In some embodiments, the described elements may be configured to reside on a tangible, persistent, addressable storage medium and may be configured to execute on one or more processors. These functional elements may in some embodiments include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. Although the example embodiments have been described with reference to the components, modules and units discussed herein, such functional elements may be combined into fewer elements or separated into additional elements. Various combinations of optional features have been described herein, and it will be appreciated that described features may be combined in any suitable combination. In particular, the features of any one example embodiment may be combined with features of any other embodiment, as appropriate, except where such combinations are mutually exclusive. Throughout this specification, the term "comprising" or "comprises" means including the component(s) specified but not to the exclusion of the presence of others.

The embodiments described herein may be embodied as sets of instructions stored as electronic data in one or more storage media. Specifically, the instructions may be provided on a transitory or non-transitory computer-readable media. When executed by the processor, the processor is configured to perform the various methods described in the following embodiments. In this way, the methods may be computer-implemented methods. In particular, the processor and a storage including the instructions may be incorporated into a vehicle. The vehicle may be an autonomous vehicle (AV).

Whilst the following embodiments provide specific illustrative examples, those illustrative examples should not be taken as limiting, and the scope of protection is defined by the claims. Features from specific embodiments may be used in combination with features from other embodiments without extending the subject-matter beyond the content of the present disclosure.

Figure 1:
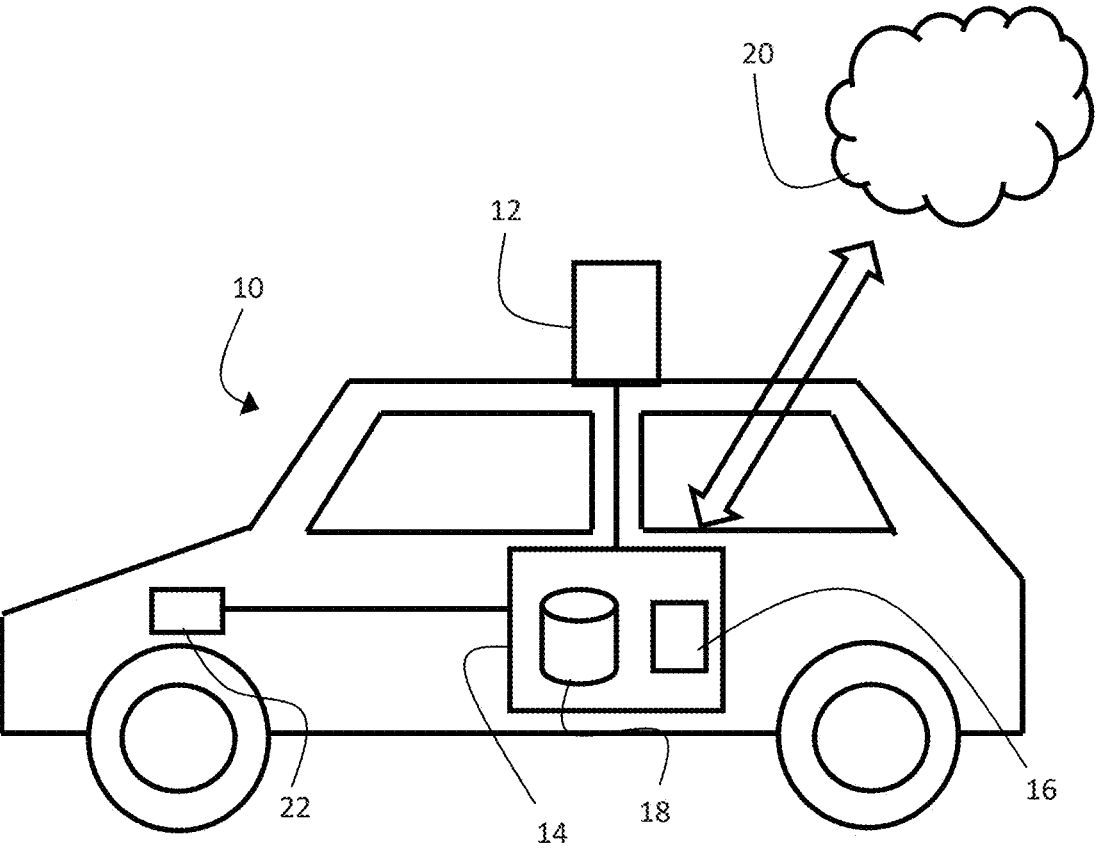
FIG. 1 shows an autonomous vehicle (AV) according to one or more embodiments.

With reference to FIG. 1, an AV 10 may include a plurality of sensors 12. The sensors 12 may be mounted on a roof of the AV 10, or integrated into the bumpers, grill, bodywork, etc. The sensors 12 may be communicatively connected to a computer 14. The computer 14 may be onboard the AV 10. The computer 14 may include a processor 16 and a memory 18. The memory may include the non-transitory computer-readable media described above. Alternatively, the non-transitory computer-readable media may be located remotely and may be communicatively linked to the computer 14 via the cloud 20. The computer 14 may be communicatively linked to one or more actuators 22 for control thereof to move the AV 10. The actuators may include, for example, a motor, a braking system, a power steering system, etc.

The computer 14 includes an autonomy stack for controlling the AV 10. The autonomy stack 34 may control the AV 10 in response to the sensor data. To achieve this, the autonomy stack may include one or more machine learning models. The one or more machine learning models may include an end-to-end model that is trained to provide control commands to actuators of the AV 10 in response to the sensor data. The one or more machine learning models may include machine learning models respectively responsible for perception, planning, and control. This may be in addition to the end-to-end model or as an alternative to the end-to-end model. Perception functions may include object detection and classification based on sensor data. Planning functions may include object tracking and trajectory generation. Control functions including setting control instructions for one or more actuators 22 of the AV 10 to move the AV 10 according to the trajectory.

The sensors 12 may include various sensor types. Examples of sensor types include LIDAR sensors, RADAR sensors, and cameras. Each sensor type may be referred to as a sensor modality. Each sensor type may record data associated with the sensor modality. For example, the LiDAR sensor may record LiDAR modality data.

The data may capture various scenarios that the AV 10 encounters. For example, a scenario may include a visible scene around the AV 10 and may include roads, buildings, weather, objects (e.g. other vehicles, pedestrians, animals, etc.), etc.

Figure 2:
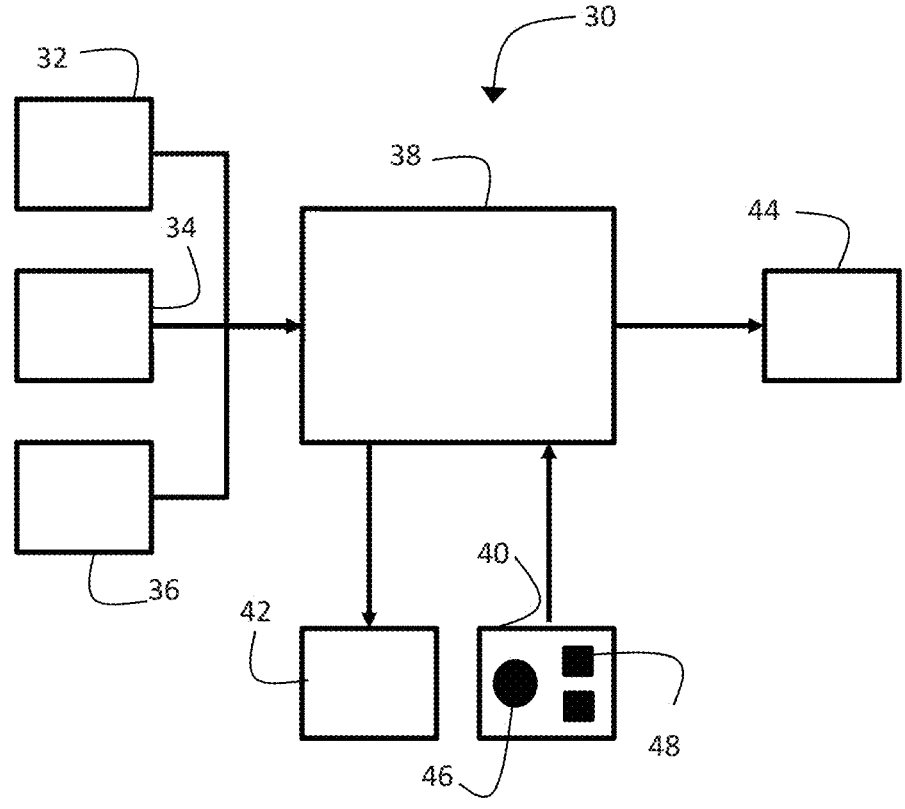
FIG. 2 shows a block diagram of a simulation system, according to one or more embodiments.

With reference to FIG. 2, a simulation system 30 includes a scenario repository 32, an autonomy stack 34, a non-ego agent repository 36, a simulator 38, a user input device 40, a display device 42, and a report repository 44. The various repositories may be provided on one or more storage media.

The scenario repository 32 includes scenarios includes a plurality of scenarios that have been obtained from the scenarios captured by the AV 10, for example.

The autonomy stack 34 may be the autonomy 34 software used by the AV 10. The autonomy stack 34 controls an ego agent within the simulator 38.

The non-ego agent repository 36 stores a plurality of non-ego agents that can be included with the scenarios in the simulator 38. The non-ego agents are provided a respective autonomy agent logic for controlling the non-ego agent in the simulator. The non-ego agents are objects selected from a list of objects including: a vehicle, a human, and a non-human animal.

In a method of operating the simulation system, the method comprises receiving, by the simulator 38, a scenario, a non-ego agent, and an ego agent, from the respective repository. The method also includes running a simulation of the scenario including the ego agent and the non-ego agent on the simulator. It will be appreciated that whilst one non-ego agent is described, in some scenarios more than one non-ego agent is provided. For example, there may be a plurality of non-ego agents in a scenario.

The user input device 40 may include at least one direction input 46 and a plurality of push buttons 48. The direction input may be a push button, where the direction input 46 push button and the push buttons 48 are provided as part of a keyboard. Alternatively, the direction input 46 may be a joystick, or the like, and the push buttons 48 may be push buttons on a controller.

The display device 42 may include a display for displaying the simulation to a user so the user can visually observe the scenario and the ego agent's behaviour in the scenario.

The method may include controlling the non-ego agent in an autonomy mode using an autonomy agent logic. The method may also include controlling the non-ego agent in a manual mode using inputs from the user input device. For example, the joystick 46 may control a direction of travel of the non-ego agent. The plurality of push buttons 48 may control one or more kinematic parameters of the non-ego agent.

The kinematic parameters may be selected from a list of kinematic parameters including velocity, acceleration and deceleration.

The method includes receiving, form the user input device, a control change input, then switching control of the non-ego agent between the autonomy mode and the manual mode in response to receiving the control change input. More specifically, the simulation may be started where the non-ego agent is in an autonomy mode and the control change input switches control of the non-ego agent to the manual mode in response to receiving the control change input.

Figure 3C:
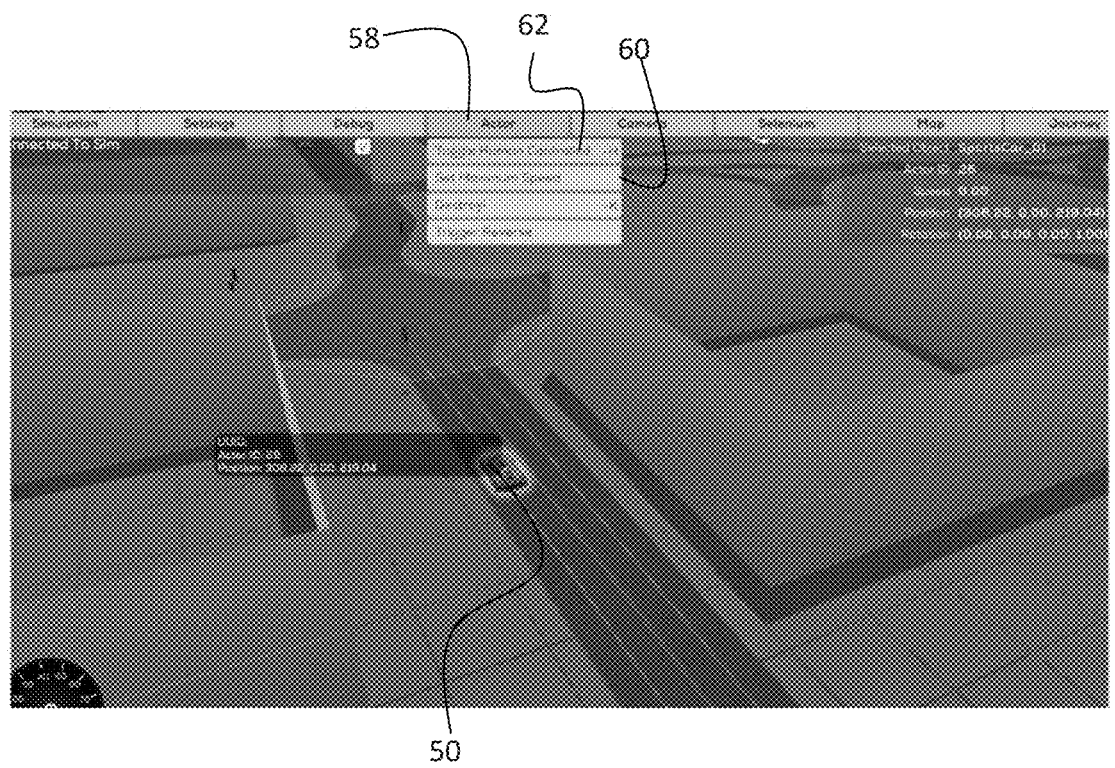

Switching from the autonomy mode to the manual mode is shown in steps with reference to FIGS. 3A to 3C.

With reference to FIG. 3A, the non-ego agent 50 is shown in an urban scenario, including roads 52, buildings 54, and pavements 56. In FIG. 3A, the non-ego agent is in the form of a vehicle, e.g. a car, and is operating in the autonomy mode.

With reference to FIG. 3B, the method may comprise receiving, from the user input device, a selection input selecting the non-ego agent 50. When selected, the method may comprise highlighting the non-ego agent on the display device. The highlighting may include adding a line of light around the non-ego agent.

With reference to FIG. 3C, when the non-ego agent 50 has been selected, the user input device may receiving an input to select a tab at a top of the display device. The tab 58 may be titled "agent", or another synonym, e.g. "actor". Once the agent tab has been selected by the user, the method may comprise displaying a drop-down menu 60 on the display device, where the drop-down menu includes a toggle 62. The method then comprises receiving the control change input, which itself comprises receiving a user selection of the toggle. The toggle enables toggling between the autonomy mode and the manual mode.

A benefit of operating the non-ego agent in manual mode is that it is possible to augment the set of the scenarios in real time. This is because if the engineering team wishes to investigate how the ego agent behaves when the non-ego agent behaves erratically, it is possible to input the erratic behaviour manually. Whereas, it would take far too long to obtain such data by observing objects such as cars in the real world waiting for one to behave in a very particular and erratic manner.

The next stage of the method is recording a sequence of events involving the ego agent to form a report. More particularly, the method comprises identifying an infraction between the ego agent and the non-ego agent, and recording the infraction as an event of the sequence of events. The term infraction is used here to mean undesirable behaviour of the ego-agent. For instance, undesirable behaviour may include uncomfortable movement of the AV for any occupants, for example. Examples of such infractions include: a collision involving the ego agent, a distance between the ego agent an object in the scenario being less than a minimum distance threshold, a deceleration of the ego agent being greater than a deceleration threshold, an acceleration of the ego agent being greater than an acceleration threshold, a turn radius of the ego agent being greater than a turn radius threshold, and a jerk of the ego agent being greater than the turn radius threshold.

The collision may be a collision between the ego-agent and the non-ego agent, or another non-ego agent which has responded to the behaviour of the manually controlled non-ego agent in an unpredictable manner. This is particularly interesting at a junction in the scenario, e.g. where the non-ego agent can be manually controlled not to obey road rules, e.g. not stopping at a red light, or driving on the wrong side of the road.

The distance between the ego agent and an object in the scenario may be a distance between the ego agent and the non-ego agent. This may be investigated by, for example, manually controlling the non-ego agent to tailgate closely behind the ego agent, or merging a lane into a lane of the ego agent in a quick and tight swerve, and without indicating. Alternatively, the object may be another non-ego agent, e.g. another vehicle or a pedestrian, who has reacted in response to erratic behaviour of the manually controlled non-ego agent. For example, the non-ego agent may not slow down and stop at a pedestrian crossing, so pedestrians may jump out of the way to avoid a collision and into the path of the ego agent.

In this way, the sequence of events includes events involving the ego vehicle interacting with the non-ego vehicle, and also may include events involving the ego vehicle interacting with other objects that have reacted to the behaviour of the manually controlled non-ego agent.

Once created, system sends a signal from the simulator which includes the report log to the report repository.

The engineering team can then use any reports in the repository to identify causes within the autonomy stack that caused the ego agent to behave in a manner that caused the infraction. In this way, the simulation system contributes to improving the autonomy stack by making the autonomy stack less prone to infractions so that when it is implemented in the AV 10 of FIG. 1, it is less likely to experience infractions in the real-world.

The method described above may be a computer-implemented method.

With reference to FIG. 4, the one or more embodiments described above may be summarised as a computer-implemented method of testing an autonomy stack for an autonomous vehicle in a simulated environment, the computer-implemented method comprising: receiving 100 a scenario, a non-ego agent, and an ego agent, the scenario constructed from real-world sensor data and representing a real-world environment, wherein the ego agent is controlled by the autonomy stack; running 102 a simulation of the scenario including the ego agent and the non-ego agent; receiving 104, from a user input device, a control change input; switching 106 control of the non-ego agent between the autonomy mode and the manual mode in response to receiving the control change input; 108 recording a sequence of events involving the ego agent to form a report; and sending 110 a signal including the report to a report log.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:

1. A computer-implemented method of testing an autonomy stack for an autonomous vehicle in a simulated environment, the computer-implemented method comprising:

receiving a scenario, a non-ego agent, and an ego agent, the scenario representing a real-world environment, wherein the ego agent is controlled by the autonomy stack;

running a simulation of the scenario including the ego agent and the non-ego agent;

receiving, from a user input device, a control change input;

switching control of the non-ego agent between an autonomy mode and a manual mode in response to receiving the control change input;

wherein the switching control of the non-ego agent between the autonomy mode and the manual mode comprises starting the simulation with the non-ego agent in the autonomy mode and switching control of the non-ego agent to the manual mode in response to receiving the control change input;

recording a sequence of events involving the ego agent to form a report; and sending a signal including the report to a report log.

2. The computer-implemented method of claim 1, further comprising:

controlling the non-ego agent in the autonomy mode using an autonomy agent logic.

3. The computer-implemented method of claim 1, further comprising:

controlling the non-ego agent in the manual mode using inputs from the user input device.

4. The computer-implemented method of claim 3, wherein the user input device includes at least one direction input to control a direction of travel of the non-ego agent, and a plurality of push buttons to control one or more kinematic parameters of the non-ego agent.

5. The computer-implemented method of claim 4, wherein the one or more kinematic parameters is selected from a list of kinematic parameters including, velocity, acceleration, and deceleration.

6. The computer-implemented method of claim 1, further comprising: identifying an infraction between the ego agent and the non-ego agent, and recording the infraction as an event of the sequence of events.

7. The computer-implemented method of claim 6, wherein the infraction is selected from a list of infractions including: a collision involving the ego agent, a distance between the ego agent an object in the scenario being less than a minimum distance threshold, a deceleration of the ego agent being greater than a deceleration threshold, an acceleration of the ego agent being greater than an acceleration threshold, and a turn radius of the ego agent being greater than a turn radius threshold.

8. The computer-implemented method of claim 1, wherein the non-ego agent is an object selected from a list of objects including: a vehicle, a human, and a non-human animal.

9. The computer-implemented method of claim 1, further comprising: displaying the simulation on a display device.

10. The computer-implemented method of claim 9, further comprising: receiving, from the user input device, a selection input selecting the non-ego agent; and highlighting the non-ego agent on the display device in response to receiving the selection input selecting the non-ego agent.

11. The computer-implemented method of claim 10, wherein the highlighting the non-ego agent on the display device occurs prior to:

receiving the control change input; and switching control of the non-ego agent between the autonomy mode and the manual mode in response to receiving the control change input.

12. The computer-implemented method of claim 10, wherein the receiving the control change input comprises receiving a user selection of a toggle enabling toggling between the autonomy mode and the manual mode.

13. The computer-implemented method of claim 12, further comprising: displaying on the display device a drop-down menu including the toggle.

14. The computer-implemented method of claim 1, wherein the sequence of events involves events where the ego agent interacts with the non-ego agent.

15. The computer-implemented method of claim 1, wherein the scenario is constructed from real-world sensor data.

16. A non-transitory computer-readable medium, having instructions stored thereon that when executed by one or more processors, cause the one or more processors to perform the computer-implemented method of claim 1.

17. A simulation system comprising:

storage having a scenario, a non-ego agent, an ego agent, and instructions stored thereon, the scenario representing a real-world environment, wherein the ego agent is controlled by the autonomy stack; and at least one processor configured to execute the instructions to:

receiving a scenario, a non-ego agent, and an ego agent from the storage;

running a simulation of the scenario including the ego agent and the non-ego agent;

receiving, from a user input device, a control change input;

switching control of the non-ego agent between the autonomy mode and the manual mode in response to receiving the control change input;

recording a sequence of events involving the ego agent to form a report; and sending a signal including the report to a report log.

* * * * *